(12) United States Patent
Chiang

(10) Patent No.: US 8,441,781 B2
(45) Date of Patent: May 14, 2013

(54) VIBRATION DAMPENING STRUCTURE FOR ELECTRONIC DEVICE

(75) Inventor: Tsung-Hsun Chiang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 237 days.

(21) Appl. No.: 12/982,890

(22) Filed: Dec. 31, 2010

(65) Prior Publication Data

US 2012/0140383 A1    Jun. 7, 2012

(30) Foreign Application Priority Data

Dec. 7, 2010   (TW) .............................. 99142684 A

(51) Int. Cl.
*H05K 7/20*    (2006.01)
(52) U.S. Cl.
USPC ...... 361/679.01; 361/695; 361/690; 361/694; 361/679.48; 312/236

(58) Field of Classification Search ............. 361/679.48, 361/695, 690, 694; 415/214.1
See application file for complete search history.

(56) References Cited

U.S. PATENT DOCUMENTS

| | | | |
|---|---|---|---|
| 7,522,415 B2* | 4/2009 | Fan et al. ...................... | 361/695 |
| 2008/0252859 A1* | 10/2008 | Nagahata et al. ............... | 353/61 |
| 2010/0142143 A1* | 6/2010 | Ong et al. ................ | 361/679.48 |

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

An electronic device includes a casing, a fan bracket and a fan module. The casing includes a top plate and a bottom plate spaced from and facing the top plate. The fan bracket is mounted on the bottom plate. The fan module includes a fan, a fan holder enclosing the fan therein, and two vibration dampening structures mounted on opposite top and bottom sides of the fan holder. The fan holder is engaged in the fan bracket. The vibration structures protrude beyond the top and bottom sides of the fan holder and abut the top plate and the bottom plate of the casing, respectively.

20 Claims, 7 Drawing Sheets

VIBRATION DAMPENING STRUCTURE FOR ELECTRONIC DEVICE

BACKGROUND

1. Technical Field

The present disclosure relates to vibration dampening structures, and more particularly to vibration dampening structures for electronic devices.

2. Description of Related Art

A server typically includes at least a power supply device, a motherboard, a hard disk drive, and an optical disk drive, all of which can generate considerable heat during operation.

A fan module is usually secured on a casing of the server for cooling the electronic components of the server. However, the fan module is liable to vibrate and produce noise when running, and this may inconvenience people in the vicinity of the server.

It is desirable to provide an electronic device having a vibration dampening structure which can overcome the described limitations.

DETAILED DESCRIPTION

Figure 1:
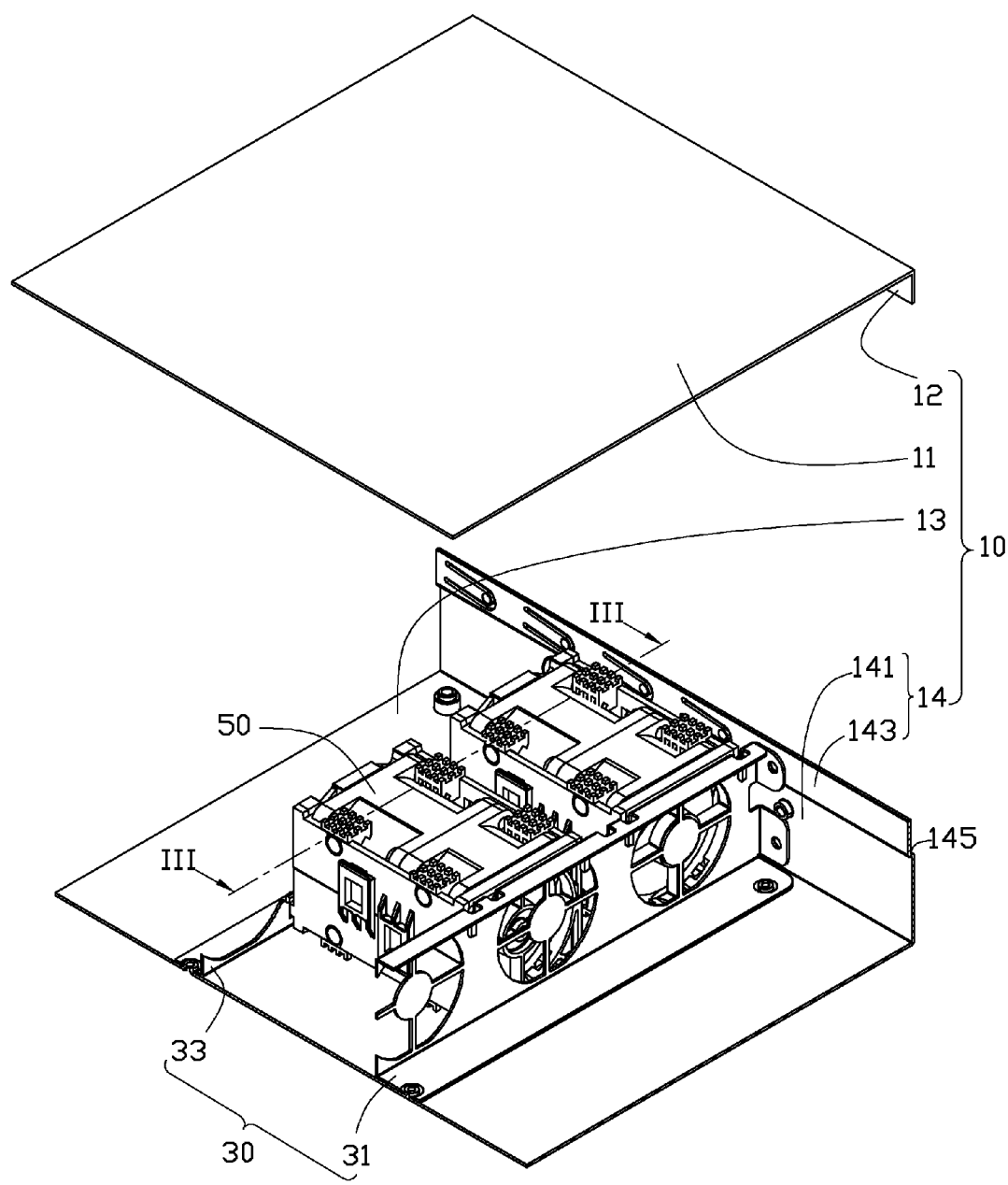
FIG. 1 is an assembled view of part of an electronic device according to an embodiment of the present disclosure, wherein a top cover of the electronic device is taken off for clarity.
Figure 2:
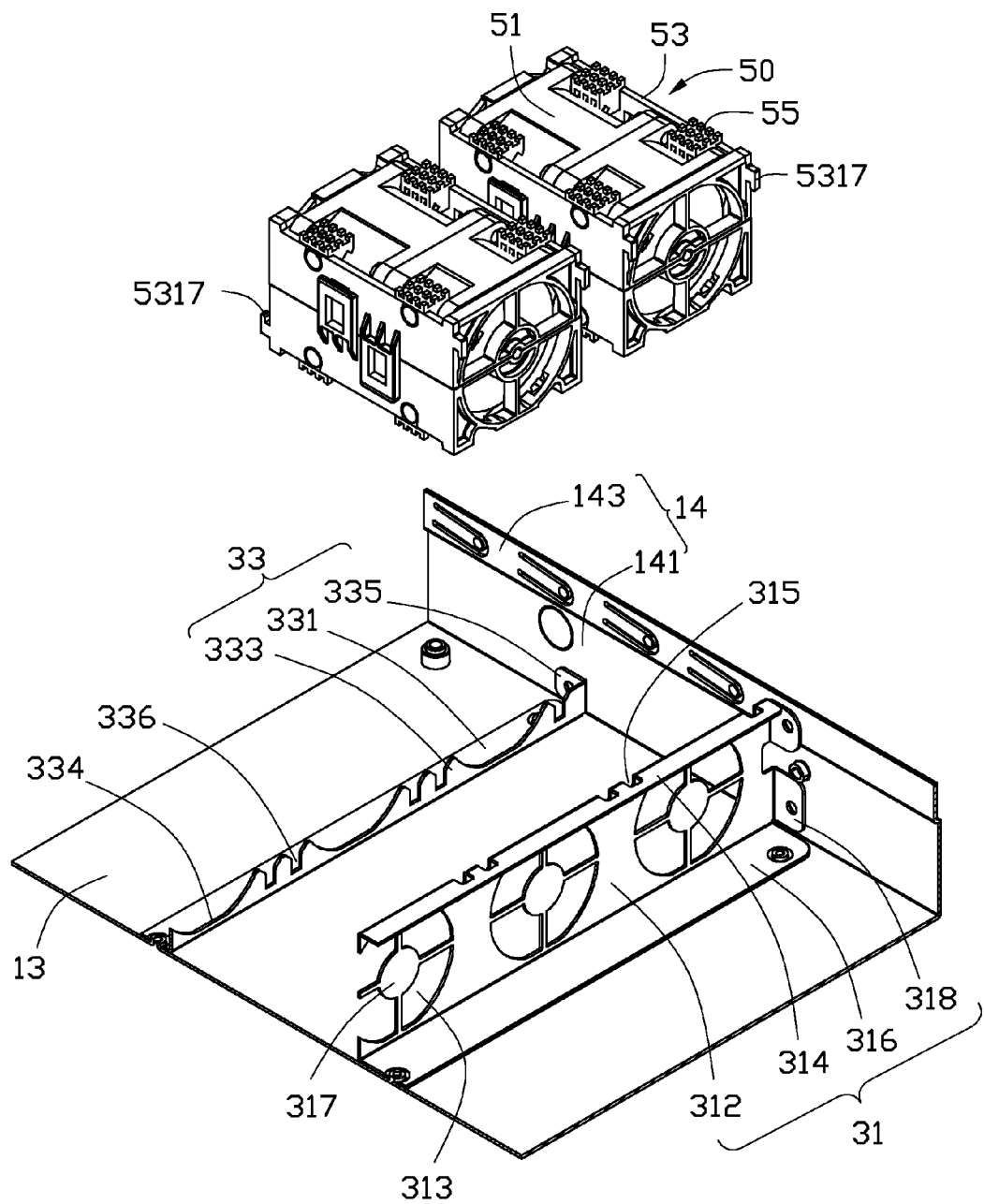
FIG. 2 is an exploded view of the electronic device of FIG. 1, but with the top cover omitted.

Referring to FIGS. 1-2, an electronic device is shown. The electronic device includes a casing 10, a fan bracket arrangement 30 secured on the casing 10, and a plurality of fan modules 50 mounted on the fan bracket arrangement 30. The fan modules 50 cool heat-generating components (not shown) of the electronic device. The electronic device may for example be a personal computer or a server. In this embodiment, the electronic device is a one rack unit server.

In the description that follows, the stated orientations of all of the elements of the electronic device are with reference to the orientations of the elements as shown in FIG. 1.

The casing includes a top cover (not labeled), and a bottom cover (not labeled) engaging with the top cover. The top cover includes a top plate 11, and an elongated side plate 12 extending downwardly from a right side of the top plate 11. The bottom cover includes a bottom plate 13 opposing and spaced from the top plate 11, and an elongated extending plate 14 extending upwardly from a right side of the bottom plate 13. The extending plate 14 includes a first extending portion 141 perpendicularly extending from the bottom plate 13, and a second extending portion 143 located at an inner side of a top of the first extending portion 141. An elongated connecting portion 145 is between the first extending portion 141 and the second extending portion 143, and interconnects the first extending portion 141 and the second extending portion 143. A size of the side plate 12 is substantially equal to that of the second extending portion 143 of the extending plate 14. When the electronic device is assembled, the side plate 12 is located at an outside of the second extending portion 143, with a bottom end of the side plate 12 abutting the connecting portion 145. Opposite bottom and top sides of the fan modules 50 respectively abut the bottom plate 13 and the top plate 11 of the casing 10, but both fan modules 50 (as illustrated) are spaced from the second extending portion 143.

The fan bracket arrangement 30 includes a first bracket 31, and a second bracket 33 spaced from the first bracket 31. A space is defined between the first bracket 31 and the second bracket 33 for installing the fan modules 50. The first bracket 31 includes an elongated baffle 312, an elongated top flange 314, an elongated bottom flange 316, and a side flange 318. The top flange 314 and the bottom flange 316 respectively extend frontwards from top and bottom sides of the baffle 312. The side flange 318 extends frontwards from a right end of the baffle 312. A plurality of circular openings 313 is defined in the baffle 312 to allow airflow through the baffle 312. A cross shaped guard 317 is positioned in each opening 313. The bottom flange 316 is secured on the bottom plate 13 of the casing 10. The first bracket 31 has two cutouts 315 defined at opposite sides of each opening 313. Each cutout 315 includes a horizontal portion within the top flange 314, and a vertical portion within the baffle 312. The side flange 318 abuts the first extending portion 141 of the extending plate 14 of the casing 10.

The second bracket 33 includes an elongated bottom flange 331, an engaging flange 333 and a side flange 335. The bottom flange 331 is secured on the bottom plate 13 of the casing 10, and spaced from the bottom flange 316 of the first bracket 31. The engaging flange 333 extends upwardly from a front side of the bottom flange 316. The engaging flange 333 is parallel to and opposes the baffle 312 of the first bracket 31. A plurality of generally arc-shaped grooves 334 is defined in the engaging flange 333, and are respectively aligned with the openings 313 of the baffle 312. Two orifices 336 are defined in the engaging flange 333 at each groove 334, with the orifices 336 located at opposite sides of the groove 334, respectively. The side flange 335 abuts the first extending portion 141 of the extending plate 14 of the casing 10.

Figure 3:
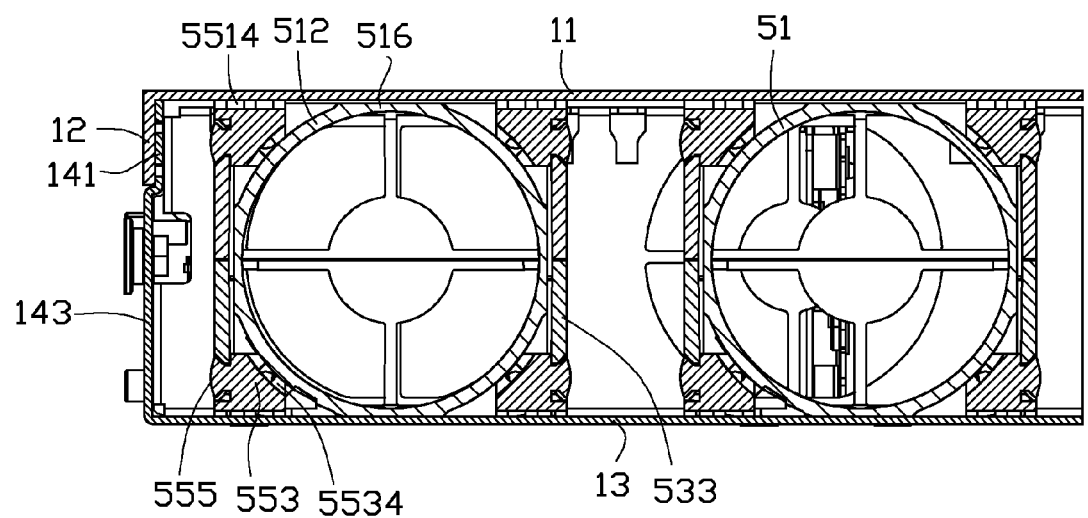
FIG. 3 is a cross sectional view of the electronic device of FIG. 1 when the electronic device is assembled, corresponding to line III-III of FIG. 1.
Figure 4:
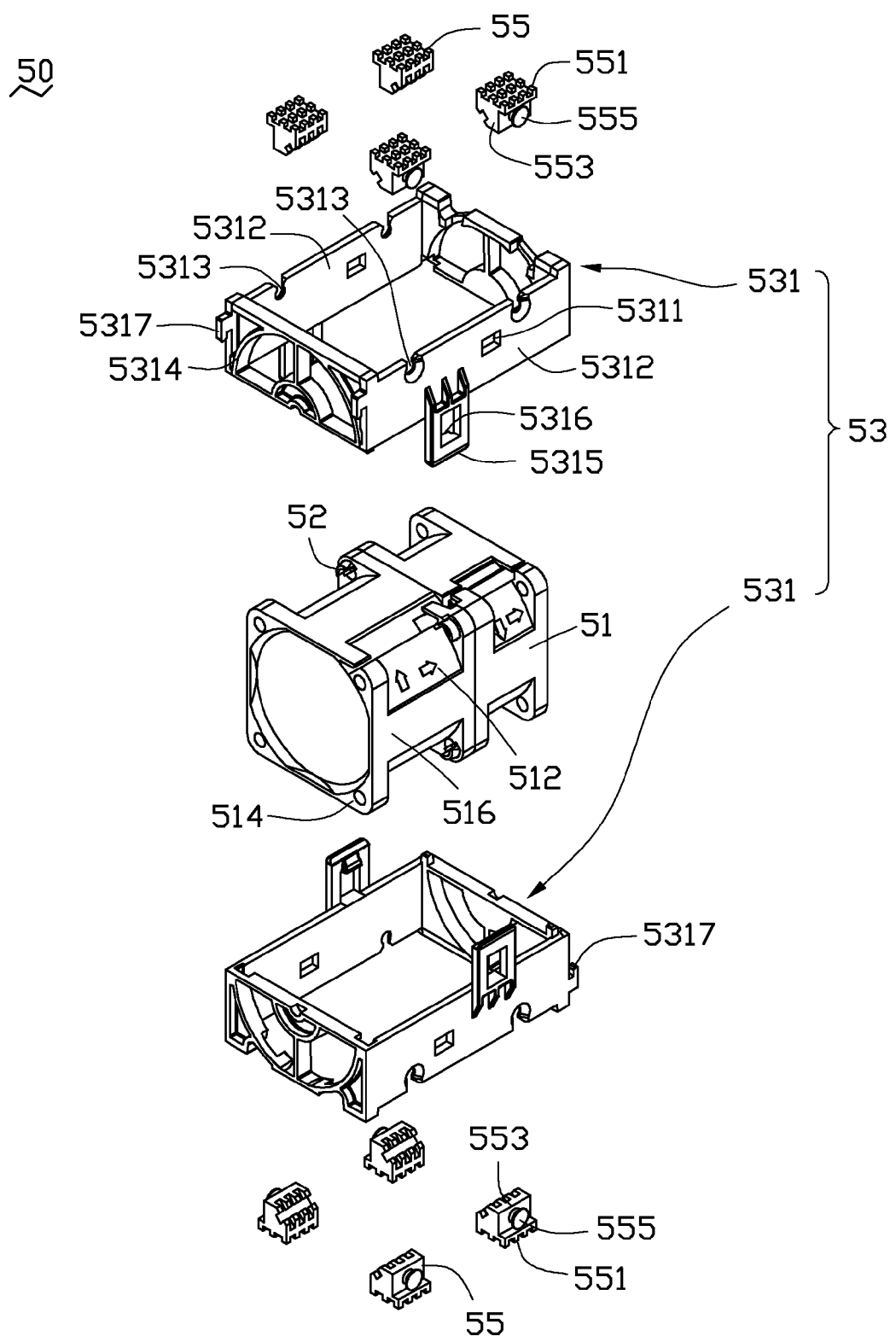
FIG. 4 is an exploded, isometric view of a fan module of the electronic device of FIG. 2.

Referring also to FIGS. 3-4, each fan module 50 includes two fans 51, a fan holder 53 enclosing the two fans 51, and a plurality of vibration dampening structures 55 mounted on the fan holder 53.

Each fan 51 of each fan module 50 includes a hollow, cylindrical body 512, eight triangular protruding portions 514 at opposite ends of the body 512, and four elongated protruding plates 516 formed on a periphery of the body 512. Four of the protruding portions 514 protrude outwardly from four corners of one of the ends of the body 512, respectively; and the other four protruding portions 514 protrude outwardly from four corners of the other end of the body 512, respectively. The protruding portions 514 located at each end of the body 512 are evenly spaced from each other. The protruding plates 516 are evenly spaced from each other and form four borders of the fan 51. Each of opposite ends of each protruding plate 516 connect with two corresponding protruding portions 514. The two fans 51 are coaxial with each other. In particular, the fans 51 are aligned with each other in such a manner that the protruding portions 514 of one end of one of the fans 51 abut the protruding portions 514 of one end of the other fan 51. Four screws 52 extend through the four pairs of abutting protruding portions 514 to attach the two fans 51 together. The interiors of the bodies 512 of the two fans 51 communicate with each other.

The fan holder 53 of each fan module 50 includes two identical frames 531. The frames 531 are assembled together one on the other, with a top one of the frames 531 defined as being "right-side-up," and a bottom one of the frames 531 defined as being "upside-down." The following description is that of the right-side-up frame 531. The frame 531 has a hollow, rectangular configuration, and includes two combining plates 5312 and two connecting covers 5314. The combining plates 5312 are elongated, spaced from each other, and parallel to each other. The connecting covers 5314 are between the combining plates 5312, and respectively connect opposite ends of the combining plates 5312. A top edge of each combining plate 5312 defines two U-shaped grooves 5313 for engagement of two corresponding vibration dampening structures 55 thereat. A clip 5315 extends downwardly from an outer face of the combining plate 5312. The clip 5315 has an extending plate 5316 protruding inwardly from a bottom portion of a main body (not labeled) thereof. A rectangular hole 5311 is defined in a central portion of the combining plate 5312, to receive a corresponding extending plate 5316 of the other frame 531 therein. Two L-shaped clasps 5317 are formed on front ends (edges) of the two combining plates 5312, respectively.

Figure 5:
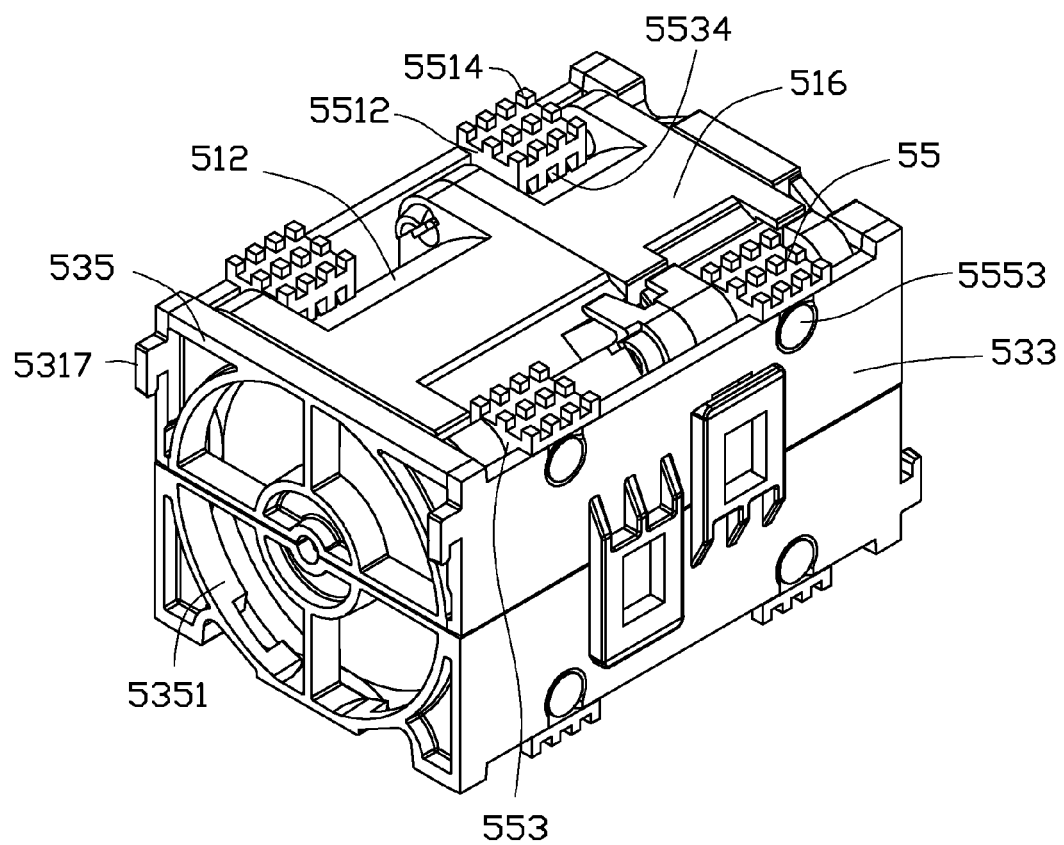
FIG. 5 is an enlarged, assembled view of the fan module of FIG. 4.

Referring also to FIG. 5, when each fan module 50 is assembled, the fan holder 53 is assembled with the two fans 51. Firstly, the fans 51 are assembled together, as described above. Then one of the frames 531 is inverted, and the pair of fans 51 is placed in that frame 531. The other frame 531 is placed over the subassembly, so that the two frames 531 are located at top and bottom sides of the fans 51, with the clips 5315 of the two frames 531 oriented generally toward each other but staggered. The two frames 531 are moved toward each other until a bottom end of the top frame 531 abuts a top end of the bottom frame 531. In this process, the clips 5315 are initially elastically bent away from the corresponding combining plates 5312 while the extending plates 5316 ride along the corresponding combining plates 5312. Then when the two frames 531 contact each other, the clips 5315 elastically rebound and the extending plates 5316 snap into the corresponding holes 5311. In this state, the fan holder 53 is assembled and the two fans 51 are enclosed by the fan holder 53.

Two of the combining plates 5312 located at a same lateral side of the fan holder 53 are aligned (coplanar) with each other and cooperatively form a sidewall 533 of the fan holder 53. The other two of the combining plates 5312 located at another same lateral side of the fan holder 53 are aligned (coplanar) with each other and cooperatively form another sidewall 533 of the fan holder 53. The grooves 5313 are respectively located at top and bottom sides of the two sidewalls 533. The two sidewalls 533 firmly contact the lateral protruding plates 516 of the bodies 512 of the two fans 51. Inner surfaces of the sidewalls 533 are spaced from peripheries of the bodies 512 of the fans 51. Two of the connecting covers 5314 located at a same end of the fan holder 53 are aligned (coplanar) with each other and cooperatively form a guard 535 with holes (not labeled). The other two of the connecting covers 5314 located at another same end of the fan holder 53 are aligned (coplanar) with each other and cooperatively form another guard 535 with holes (not labeled).

The four clasps 5317 are located at opposite ends of the fan holder 53. In particular, the two clasps 5317 of the right-side-up frame 531 are oriented toward a bottom side of the fan holder 53, and the two clasps 5317 of the upside-down frame 531 are oriented toward a top side of the fan holder 53. Top and bottom ends of the guards 535 are respectively coplanar with outer surfaces of the top and bottom protruding plates 516 of the fans 51. Top and bottom ends of each of the sidewalls 533 are coplanar with top and bottom ends of the bodies 512 of the fans 51.

Figure 6:
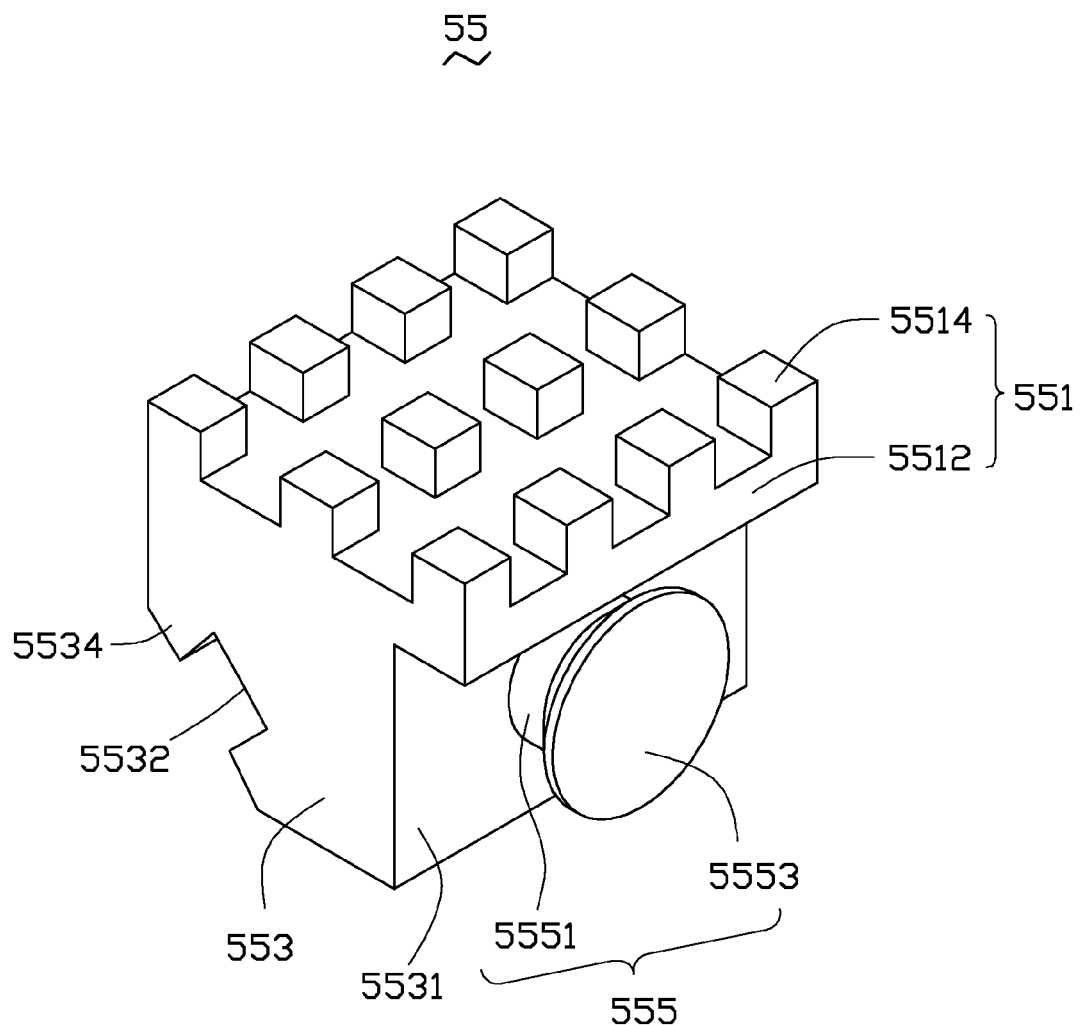
FIG. 6 is an enlarged view of a vibration dampening structure of the fan module of FIG. 5.
Figure 7:
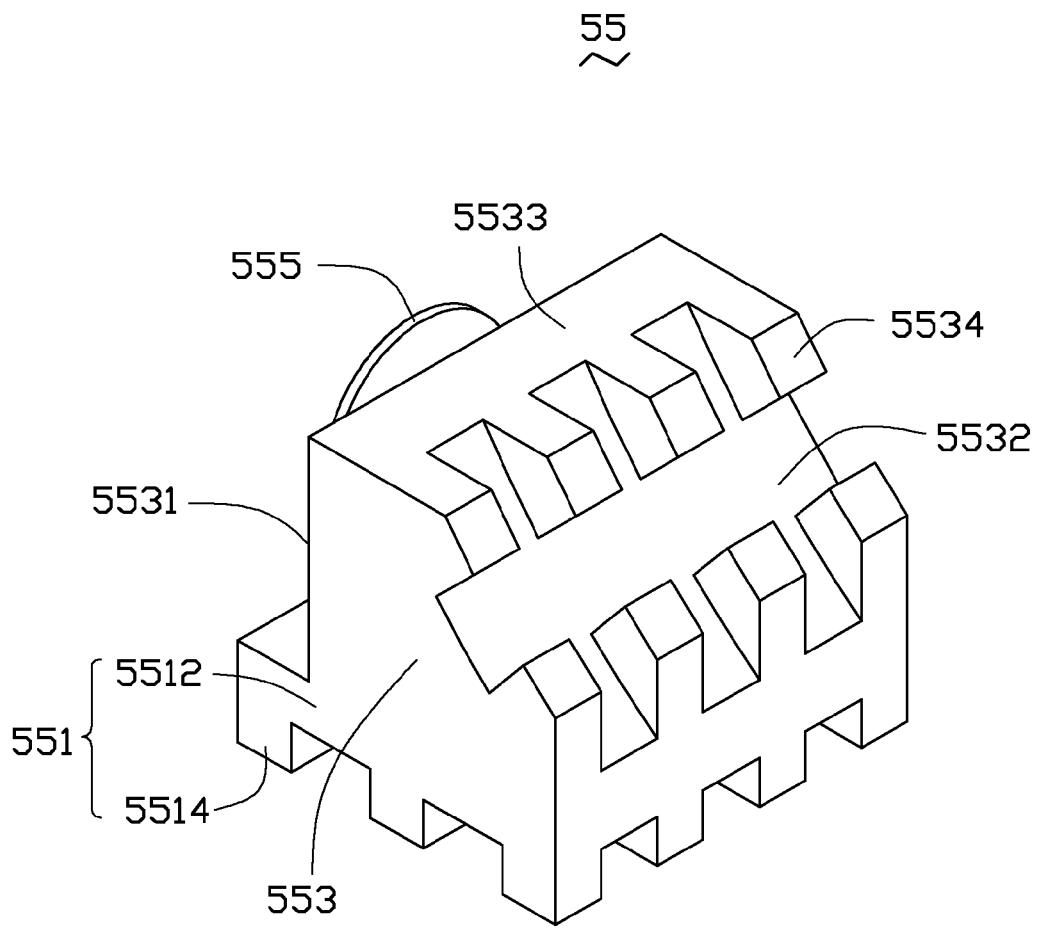
FIG. 7 is similar to FIG. 6, but showing the vibration dampening structure inverted.

Referring also to FIGS. 6-7, each of the vibration dampening structures 55 is made of elastic material, such as plastic. Each vibration dampening structure 55 includes a pressing member 551, an abutting member 553 extending from the pressing member 551, and a mounting member 555 protruding from the abutting member 553. The pressing member 551 includes a rectangular main plate 5512, and a plurality of cubical first protruding portions 5514 protruding from a top surface of the main plate 5512. The first protruding portions 5514 are evenly spaced from each other along a lengthwise direction of the main plate 5512, and are evenly spaced from each other along a widthwise direction of the main plate 5512. Top ends of the first protruding portions 5514 are coplanar.

The abutting member 553 extends downwardly from a bottom surface of the main plate 5512 of the pressing member 551. A vertical cross section of the abutting member 553 taken along a widthwise direction of the vibration dampening structure 55 is a tapered shape. In particular, one side of the cross section is vertical, and an opposite side of the cross section slants inward from a top portion thereof. Thus a width of the cross section decreases from the top portion thereof to a bottom thereof, as shown in FIG. 6. The abutting member 553 includes a rectangular mounting face 5531 perpendicular to the bottom surface of the main plate 5512, and away from an inner lateral side of the main plate 5512. The abutting member 553 includes a rectangular bottom surface 5533, which is parallel to the bottom surface of the main plate 5512 and perpendicular to the mounting face 5531. A rectangular slantwise surface 5532 extends from the inner lateral side of the main plate 5512 and connects the bottom surface 5533. Two end surfaces (not labeled) extend downwardly from opposite ends of the main plate 5512 and connect the slantwise surface 5532, the bottom surfaces 5533, and the mounting face 5531. A plurality of second protruding portions 5534 extends outwardly from the slantwise surface 5532. Outer ends of the second protruding portions 5534 are coplanar. A cross section of each second protruding portion 5534 taken along the widthwise direction of the vibration dampening structure 55 is a tapered shape. In the present embodiment, the cross section is a right-angled trapezoid.

The mounting member 555 extends from the mounting face 5531 of the abutting member 553, and includes a cylindrical neck 5551 connecting the mounting face 5531, and a disc-shaped mounting head 5553 connecting an outer end of the neck 5551. A diameter of the mounting head 5553 is larger than that of the neck 5551. The neck 5551 is located at a central portion of the mounting head 5553.

Referring to FIGS. 4-5 again, when the vibration dampening structures 55 are assembled to the fan holder 53, the vibration dampening structures 55 are pressed toward the fan holder 53 to make the necks 5551 of the mounting members 555 insert in the grooves 5313 of the sidewalls 533 of the fan holder 53. The mounting heads 5553 of the mounting members 555 are located at outsides of the sidewalls 533, and outer faces of the mounting heads 5553 are substantially coplanar with outer surfaces of the sidewalls 533. The abutting members 553 are sandwiched between the bodies 512 of the fans 51 and the sidewalls 533 of the fan holder 53, and the slantwise surfaces 5532 oppose the peripheries of the bodies 512. The second protruding portions 5534 abut the peripheries of the bodies 512.

As regards each of the vibration dampening structures 55 at the top of the fan holder 53, the bottom surface of the main plate 5512 of each pressing member 551 abuts the top edge of the corresponding sidewall 533. A thickness of the main plate 5512 is substantially equal to that of the corresponding protruding plate 516. A top surface of the main plate 5512 and the top surface of the corresponding protruding plate 516 are coplanar. The first protruding portions 5514 protrude up beyond the fans 51 and the fan holder 53.

Referring to FIGS. 1-3 again, each of the assembled fan modules 50 is then mounted on the fan bracket arrangement 30. The opposite ends of each fan module 50 respectively engage with the first bracket 31 and the second bracket 33 in such a manner that the two clasps 5317 located at the front end of the fan holder 53 are engaged in the corresponding cutouts 315 and clasp the baffle plate 312 of the first bracket 31. The two clasps 5317 located at the rear end of the fan holder 53 are engaged in the orifices 336 of the second bracket 33. The front end of the fan holder 53 opposes the corresponding opening 313 of the baffle 312 of the first bracket 31 of the fan bracket arrangement 30. The rear end of the fan holder 53 extends through the corresponding groove 334 of the engaging flange 333 and abuts the engaging flange 333 of the second bracket 33 of the fan bracket arrangement 30. The vibration dampening structures 55 respectively abut the top plate 11 and the bottom plate 13 of the casing 10. Therefore, the fan module 50 avoids contacting the casing 10 directly and the vibration dampening structures 55 absorb any vibration caused by running of the fans 51 of the fan module 50.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a casing comprising a top plate and a bottom plate spaced from and facing the top plate;
   a fan bracket mounted on the bottom plate; and
   a fan module comprising a fan, a fan holder enclosing the fan therein, and two vibration dampening structures mounted on opposite top and bottom sides of the fan holder, the fan holder engaged in the fan bracket;
   wherein the fan holder comprises two sidewalls firmly contacting lateral sides of the fan, and two grooves are defined in opposite ends of one of the sidewalls;
   each vibration dampening structure comprises an abutting member sandwiched between the fan and the fan holder and a mounting member protruding from the abutting member, the mounting member comprises a neck and a mounting head, opposite ends of the neck connect the abutting member and the mounting head, the necks of the mounting members are received in the grooves of the sidewall, respectively, and the mounting head and the abutting member of each vibration dampening structure are located at opposite sides of the sidewall and abut opposite surfaces of the sidewall; and
   the vibration dampening structures protrude beyond the top and bottom sides of the fan holder and abut the top plate and the bottom plate of the casing, respectively.

2. The electronic device of claim 1, wherein each vibration dampening structure further comprises a pressing member located at a top end of the abutting member beyond the fan holder, and the pressing member abuts the casing.

3. The electronic device of claim 2, wherein the pressing member comprises a main plate and a plurality of first protruding portions, the main plate has a first surface and a second surface opposite to the first surface, the first protruding portions protrude from the first surface of the main plate, the second surface of the main plate abuts the fan holder and a periphery of the fan, and the first protruding portions are beyond the fan holder and abut the casing.

4. The electronic device of claim 3, wherein the abutting member extends from the second surface of the main plate.

5. The electronic device of claim 4, wherein the abutting member has a slantwise surface facing the fan and a plurality of second protruding portions protruding from the slantwise surface and abutting the fan.

6. The electronic device of claim 3, wherein the main plate of the pressing member abuts the corresponding end of the sidewall and a periphery of the fan.

7. The electronic device of claim 5, wherein the second protruding portions are divided into two lines along a longitudinal direction of the slantwise surface, the two lines of the second protruding portions are respectively located at opposite sides of the slantwise surface, and the two lines of the second protruding portions are spaced from each other.

8. The electronic device of claim 1, further comprising another two of the vibration dampening structures, the other sidewall of the fan holder has two grooves defined in opposite ends thereof, and the necks of the another two vibration dampening structures are inserted in the grooves of the other sidewall.

9. The electronic device of claim 1, wherein two clasps are formed on opposite ends of the fan holder and clasp the fan bracket.

10. The electronic device of claim 9, wherein the fan bracket comprises a first bracket member and a second bracket member spaced from the first bracket member, and the clasps clasp the first bracket member and the second bracket member, respectively.

11. The electronic device of claim 10, wherein an opening is defined in the first bracket member and faces an end of the fan, and the other end of the fan abuts the second bracket member.

12. The electronic device of claim 1, wherein the casing further comprises a side plate between the top plate and the bottom plate, and the fan module is spaced from the side plate.

13. A vibration dampening structure for an electronic device, the vibration dampening structure comprising:
   a pressing member comprising a main plate and a plurality of first protruding portions, the main plate having a first surface and a second surface at opposite sides thereof, the first protruding portions protruding from the first surface;
   an abutting member extending from the second surface of the main plate; and
   a mounting member protruding from the abutting member, the mounting member comprising a neck and a mounting head, the mounting head spaced from the abutting member, and opposite ends of the neck connecting the abutting member and the mounting head;
   wherein the first protruding portions are configured for abutting a casing of the electronic device, the abutting member is configured for abutting a vibration generating component of the electronic device, and the neck of the mounting member is configured to be received in a groove of a sidewall of a housing of the electronic device housing the vibration generating component with the abutting member and the mounting head located at opposite sides of the sidewall and abutting the sidewall and the mounting member thereby mounted to the housing, such that the vibration dampening structure isolates both the vibration generating component and the housing from the casing.

14. The vibration dampening structure of claim 13, wherein a plurality of second protruding portions protrudes from the abutting member to abut the vibration generating component.

15. The vibration dampening structure of claim 14, wherein the abutting member has a slantwise surface facing toward the vibration generating component and the second protruding portions are formed on the slantwise surface.

16. The vibration dampening structure of claim 14, wherein a vertical cross section of the abutting member taken along a widthwise direction of the vibration dampening structure is a tapered shape, and a width of the cross section decreases from an end connecting the main plate to another end away from the main plate.

17. The vibration dampening structure of claim 15, wherein the abutting member comprises a mounting face opposite to the slantwise surface, and the mounting member protrudes from the mounting face.

18. The vibration dampening structure of claim 15, wherein the second protruding portions are divided into two lines along a longitudinal direction of the slantwise surface, and the two lines of the second protruding portions are spaced from each other.

19. The vibration dampening structure of claim 15, wherein outer ends of the second protruding portions are coplanar.

20. The vibration dampening structure of claim 13, wherein the vibration dampening structure is made of elastic material.

* * * * *